United States Patent [19]

Matsumoto et al.

[11] Patent Number: 5,011,417

[45] Date of Patent: Apr. 30, 1991

[54] STRUCTURE OF CONNECTION BETWEEN BUS BAR AND PRESS-CONNECTING BRANCH TERMINAL IN ELECTRIC CONNECTION BOX

[75] Inventors: Etsuji Matsumoto; Mamoru Araki; Keiichi Ozaki, all of Shizuoka, Japan

[73] Assignee: Yazaki Corporation, Tokyo, Japan

[21] Appl. No.: 534,564

[22] Filed: Jun. 7, 1990

[30] Foreign Application Priority Data

Jun. 9, 1989 [JP] Japan .................................. 1-145302

[51] Int. Cl.$^5$ .................................................. H01R 9/09
[52] U.S. Cl. ........................................ 439/76; 361/407; 439/251
[58] Field of Search ................ 439/76, 78, 55, 81, 439/721, 251; 361/395, 399, 407

[56] References Cited

U.S. PATENT DOCUMENTS

| | | | |
|---|---|---|---|
| 4,355,853 | 10/1982 | Kourimsky | 439/76 |
| 4,429,943 | 2/1984 | Inoue | 439/721 |
| 4,685,753 | 8/1987 | Isshiki et al. | 439/74 |
| 4,954,090 | 9/1990 | Shimochi | 439/78 |

*Primary Examiner*—Neil Abrams
*Attorney, Agent, or Firm*—Sughrue, Mion, Zinn, Macpeak & Seas

[57] ABSTRACT

A structure of connection between a bus bar and a press-connecting branch terminal in an electric connection box is disclosed wherein a plurality of bus bars constituting a circuit are accommodated within a casing composed of an upper case and a lower case; a housing having tab insertion holes at its bottom is formed on at least one of the upper and lower cases; a branch tab formed on one side portion of a press-connecting branch terminal is extended through the tab insertion hole into the housing to thereby constitute a connector insertion portion; and a desired one of the bus bars is press-fitted in and connected to a U-shaped slot formed in a press-connecting portion formed on the other side portion of the press-connecting terminal. The press-connecting branch terminal includes a base plate portion, opposed press-connecting portions formed on and projecting from one side of the base plate portion and each having a U-shaped slot, and one or more branch tabs formed on and projecting from the other side of the base plate portion. A seat for receiving the base plate portion is formed on an inner side of the bottom of the housing. A press projection is formed on that portion of the inner surface of the case disposed in opposed relation to the seat. Those portions of the press-connecting branch terminal and the bus bar which are press-connected together are fixedly held between the seat and the press projection.

5 Claims, 5 Drawing Sheets

STRUCTURE OF CONNECTION BETWEEN BUS BAR AND PRESS-CONNECTING BRANCH TERMINAL IN ELECTRIC CONNECTION BOX

BACKGROUND OF THE INVENTION

This invention relates to an improved structure of connection between a bus bar (constituting an internal circuitry of an electric connection box) and a press-connecting branch terminal in the electric connection box used to interconnect wire harnesses or the like.

There are known many electric connection boxes, such as a fuse box used in a vehicle or a branch connection box, which includes branch connections of a wire harness, and in order to simplify a wiring pattern, a branch circuit is formed in a concentrated manner.

The formation of a branch circuit is made either by a method in which upstanding branch tabs are formed directly from a bus bar, constituting an internal circuit, in continuous relation to the bus bar, or by a method in which there is used a press-connecting branch terminal having a branch tab at one side and a press-connecting portion at the other side which has a U-shaped slot, and an electric wire or a bus bar is press-fitted in the slot for connection.

FIGS. 10 and 11 show the prior art (Japanese Laid-Open Patent Application No. 45575/86) relating to the formation of such branch circuit.

As shown in FIG. 10, a press-connecting branch terminal a has one or more branch tabs b at one side and a press-connecting portion c at the other side which has a U-shaped slot d.

As shown in FIG. 11, the branch tab b of each press-connecting terminal a is passed through in an insertion hole h formed in a bottom of a housing g of an upper case e, and is press-fitted at its proximal portion in this insertion hole, thus fixing the branch tab. Then, a group of connection electric wires i taken, for example, form a wire harness are disposed in parallel relation between the upper case e and a lower case f, and each connection wire i is press-fitted in a desired U-shaped slot d for connection, thereby forming a branch circuit in a concentrated manner.

FIG. 12 shows a branch connection between a press-connecting terminal a' and a bus bar j (Japanese Laid-Open Patent Application No. 131483/87).

The press-connecting terminal a' has a pair of opposed press-connecting portions c' each having a U-shaped slot d', and the distal end of an opening O of the slot d' is enlarged by a tapered configuration O' to provide an insertion guide by which the connection can be effected even when the center line of the bus bar j is slightly out of registry with (that is, displaced from) the center line of the opening O.

In the prior art structure shown in FIG. 11, the press-connecting terminal a is press-fitted in and fixed to the insertion hole h. If the branch tab b is twisted, for example, when attaching an external connector to the housing g, there is a risk that this force is applied directly to a point of contact between the tab and the electric wire i. Further, the press-connecting terminal a is press-fitted and fixed at its portion indicated by thickened lines P. If the overall length L of the press-connecting terminal a is increased, it is necessary to increase the thickness of a resin layer of the upper case e, and therefore the cover becomes bulky. Further, the press-connecting terminal a is required to have a terminal width l commensurate with the value of electric current. Thus, in addition to the above necessity of increasing the thickness of the resin layer for press-fitting and fixing, the required width l is needed for securing electric current, and therefore the upper case e is still more bulky.

In the branch connection construction shown in FIG. 12, the guide (tapered portion O') for the bus bar j is provided on the press-connecting terminal a', and therefore reaction forces, resulting from corrections of the angle and position displacement of the bus bar j, act directly on the press-connecting portion, which may result in failure to achieve a proper press-connection by a resilient nature of the press-connecting portion, which may result in failure to achieve a proper press-connection by a resilient nature of the press-connecting portion c'.

SUMMARY OF THE INVENTION

The present invention has been made in view of the above problems, and an object of this invention is to provide a connection construction in which when making a press-connection between a press-connecting branch terminal and a bus bar, dimensional tolerances such as position displacement are absorbed to thereby ensuring a press-contact between the bur bar and a press-connecting portion, and an external force applied to a tab portion will not act on the press-connecting portion to thereby achieve a stable connecting condition, and further the size of the press-connecting terminal can be reduced.

According to the present invention, there is provided a structure of connection between a bus bar and a press-connecting branch terminal in an electric connection box wherein a plurality of bus bars constituting a circuit are accommodated within a casing having an upper case and a lower case; a housing having at least one tab insertion hole at its bottom is formed on at least one of the upper and lower cases; a branch tab formed on one side portion of a press-connecting branch terminal is extended through the tab insertion hole into the housing to thereby constitute a connector insertion portion; and a desired one of the bus bars is press-fitted in and connected to a U-shaped slot formed in a press-connecting portion formed on the other side portion of the press-connecting terminal; the press-connecting branch terminal including a base plate portion, opposed press-connecting portions projecting from one side of the base plate portion and each having a U-shaped slot, and at least one branch tab projecting from the other side of the base plate portion; the structure comprising a first retaining means for retaining the press-connecting branch terminal in place when the upper and lower cases are coupled together, the first retaining means including a seat formed on a bottom of the housing for receiving the base plate portion and a press portion formed on an inner surface of the case disposed in opposed relation to the seat, and a second retaining means for retaining the press-connecting branch terminal in place when the base plate portion is press-fit in the seat, whereby the press-connecting branch terminal and the bus bar which are press-connected together are fixedly held between the seat and the press portion.

In order to absorb dimensional tolerances such as position and angle deviations of the U-shaped slot of the press-connecting portion from the bus bar, it is preferred that a pair of bus bar guide walls each having a bus bar guide groove be formed on the seat for the press-connecting branch terminal.

In order to stably seat the press-connecting terminal on the seat when press-connecting the press-connecting terminal and the bus bar together, it is preferred that a free end of the base plate portion of the press-connecting branch terminal be bend into an L-shape to form a press-fitting piece, and a press-fitting groove be formed in the seat, and the press-fitting pieces be press-fitted in the press-fitting groove to thereby fix the press-connecting branch terminal to the seat.

DESCRIPTION OF THE PREFERRED EMBODIMENT OF THE INVENTION

The invention will now be described with reference to the drawings.

Figure 1:
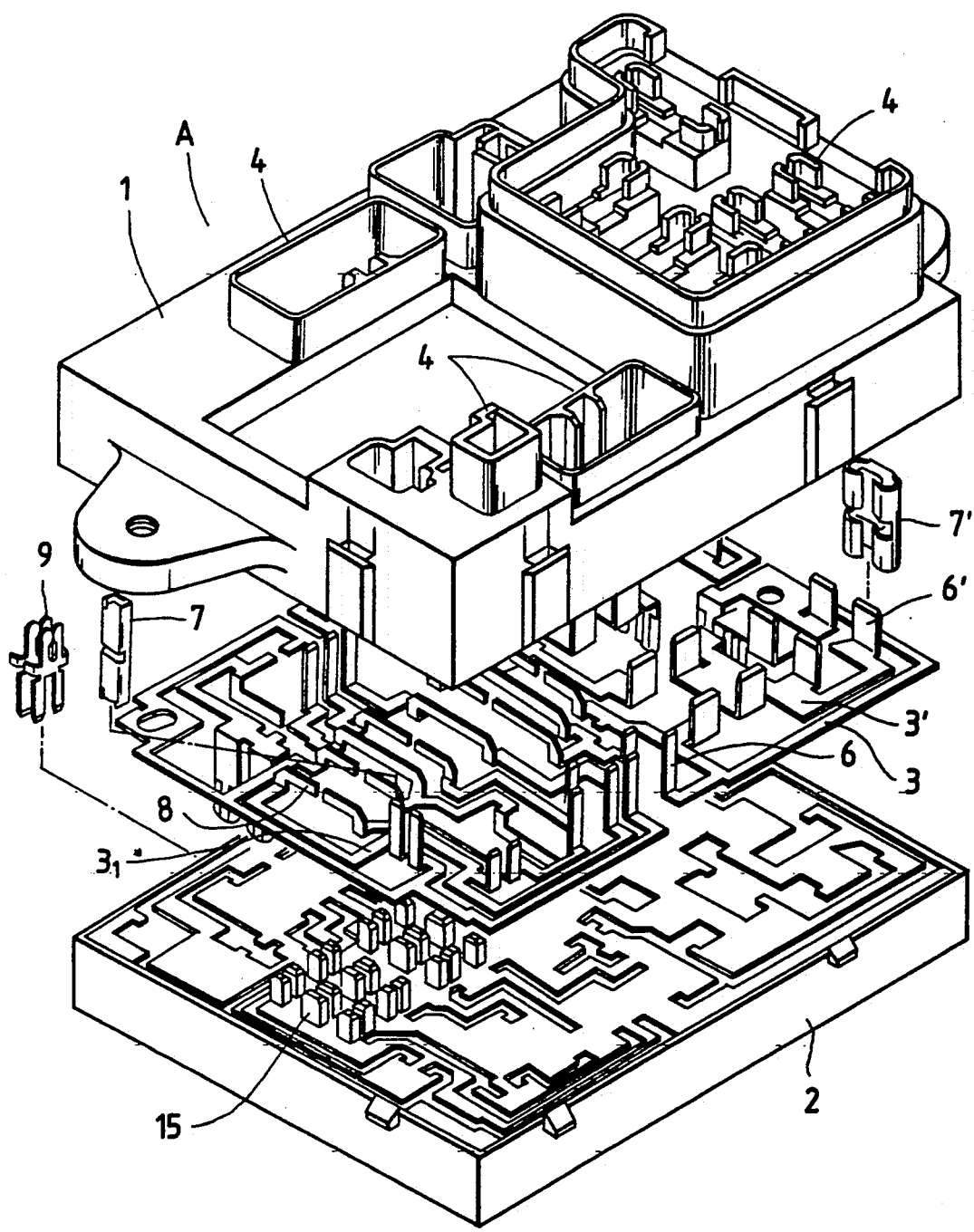
FIG. 1 is an exploded perspective view of a construction of connection between bus bars and press-connecting branch terminals in an electric connection box, provided in accordance with present invention.
Figure 2:
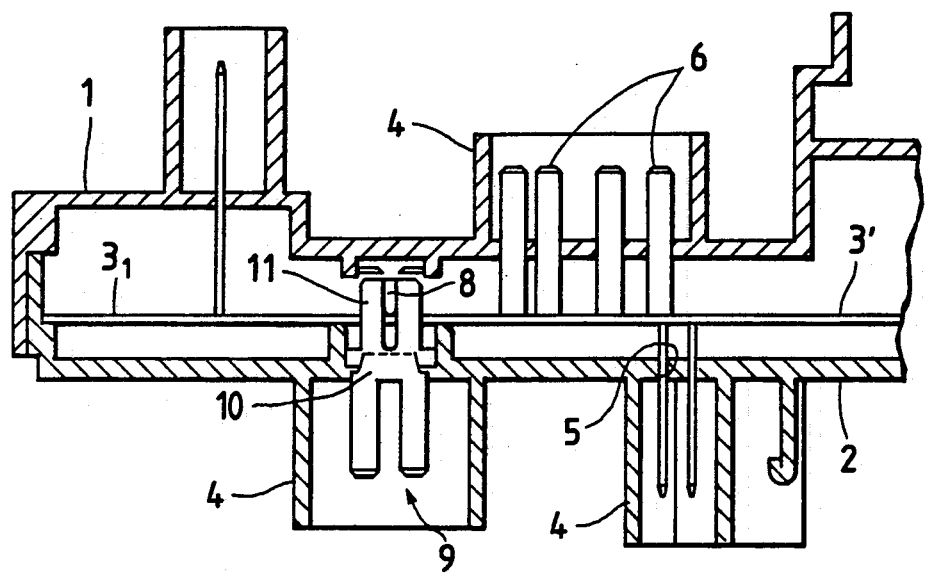
FIG. 2 is a cross-sectional view of an important portion of the construction of FIG. 1 in its assembled condition.

An electric connection box A shown in FIGS. 1 and 2 comprises an upper case 1 and a lower case 2 both of which are made of a synthetic resin, and a plurality of bus bars 3 and 3' constituting a circuitry are mounted within a case made of the upper and lower cases 1 and 2. A plurality of housings 4 for constituting a fuse connector insertion portion, a wire harness connector insertion portion, etc., are formed on outer surfaces of the two cases 1 and 2. A plurality of tab insertion holes 5 are formed in the bottom of each housing (see FIG. 2).

The width of the bus bar can be determined depending on the current capacity of the circuitry, but here in this embodiment there are used two kinds of bus bars 3 and 3' having a smaller width and a larger width, respectively.

Branch tabs 6, 6' are formed integrally on the bus bar 3, 3' in an upstanding manner, and these branch tabs extend through the respective tab insertion holes 5 into the respective housings 4, thereby constituting the above-mentioned connector insertion portions. Female-female terminals 7, 7' for relay purposes are fitted on the branch tabs 6, 6' according to the need.

The bus bar 3₁ of a smaller width has bridge-like press-connecting pieces 8 disposed perpendicularly to the plane of its circuitry. The press-connecting piece 8 is press-connected to a press-connecting branch terminal 9 supported on a terminal holder 15 mounted on the inner surface of the lower case 2.

Figure 3:
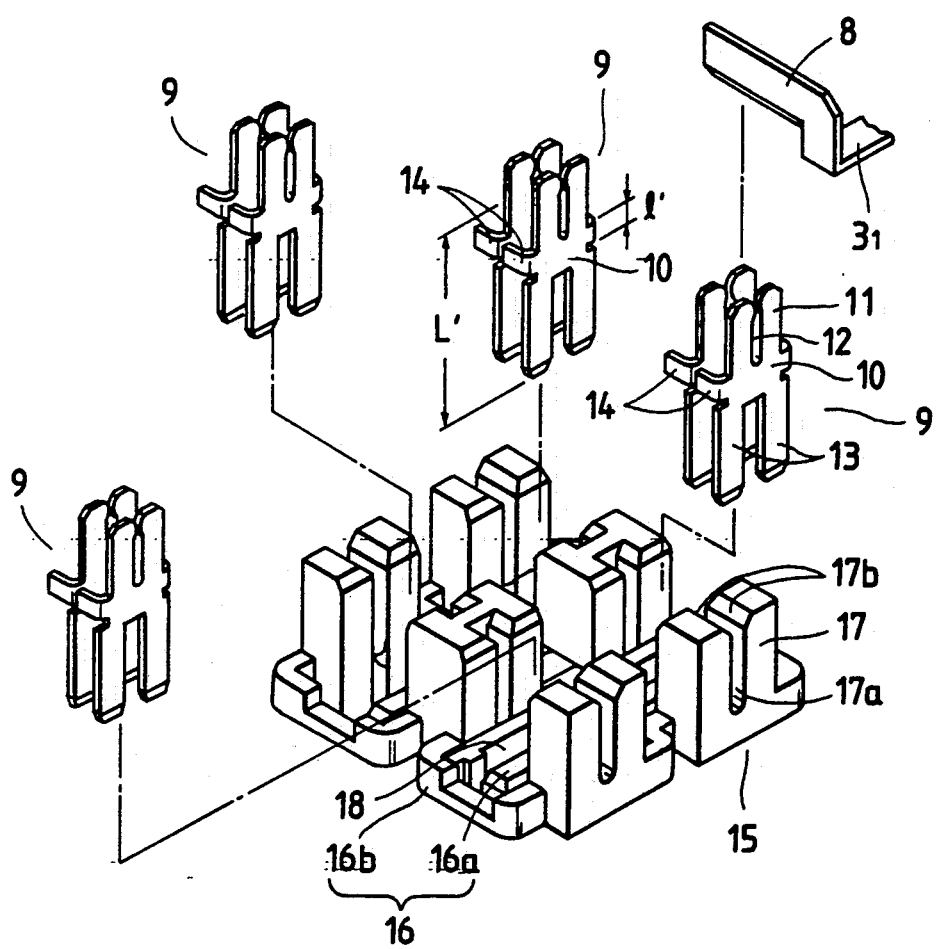
FIG. 3 is an enlarged perspective view of a terminal holder of the construction of FIG. 1.

As shown in FIG. 3, the press-connecting branch terminal 9 comprises a base plate portion 10 in the form of a U-shaped frame, opposed press-connecting portions 11 formed on and projecting from one side of the base plate portion 10 and each having a U-shaped slot 12, and one or more branch tabs 13 formed on and projecting from the other side of the base plate portion 10. In the illustrated example, the branch tabs 13 constitutes a four-pin type, but may constitute a single-pin type. The opposite free ends of the base plate portion 10 are bent into an L-shape to form press-fitting pieces 14.

The terminal holder 15 includes a seat 16 for the base plate portion 10 of the press-connecting branch terminal 9, and a pair of bus bar guide walls 17, 17 holding outer sides of the opposed press-connecting portions 11, 11. The seat 16 is so formed as to surround the tab insertion hole 5 at the reverse side of the bottom of the housing 4, and includes a positioning projection 16a for fitting in the U-shaped base plate portion 10, and a surrounding wall 16b. Press-fitting grooves 18 (see FIG. 9) for the press-fitting pieces 14 are provided at one side portion within the surrounding wall 16b.

The bus bar guide wall 17 has a bus bar guide groove 17a at its central portion, and a guide taper 17b is provided at an upper open end of the groove 17a.

Figure 4:
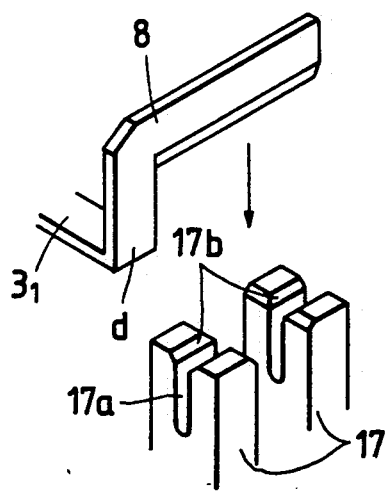
FIGS. 4 to 6 are enlarged views explanatory of dimensional relationship of a press-connecting piece, bus bar guide walls and a U-shaped slot.
Figure 5:
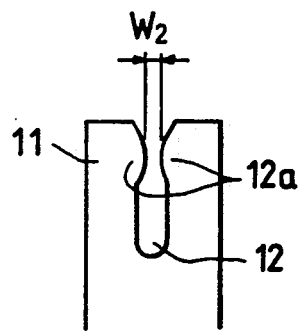
Figure 6:
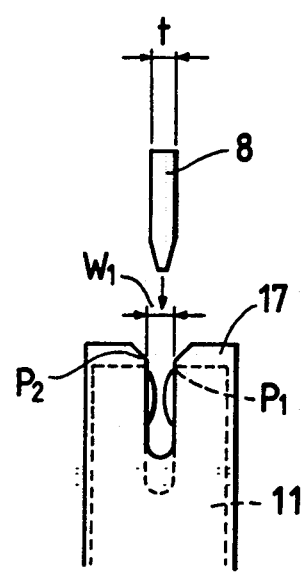

FIGS. 4 to 6 are enlarged views explanatory of dimensional relationship of the press-connecting piece 8, the bus bar guide wall 17 and the U-shaped slot 12.

Here, the thickness of the press-connecting portion 8 is represented by t, and the width of the bus bar guide groove 17a is represented by W1, and the distance between pressing blades 12a and 12a at the U-shaped slot 12 is represented by W2. The formation is made to satisfy the following formula:

$$W1 \geq t > W2$$

In addition, a lower end P1 of the guide taper 17b is slightly higher than an inlet end P2 of the pressing blade 12a.

With this arrangement, the press-connecting piece 8 is brought into contact with either the bus bar guide groove 17a or the guide taper 17b before the piece 8 is brought into contact with the pressing blades 12a, thereby absorbing dimensional tolerances of the press-connecting piece 8 and the U-shaped slot 12.

A press projection 19 is formed on the inner surface of the upper case 1 disposed in opposed relation to the terminal holder 15, and is adapted to be inserted in between the pair of bus bar guide walls 17 and 17.

Figure 7:
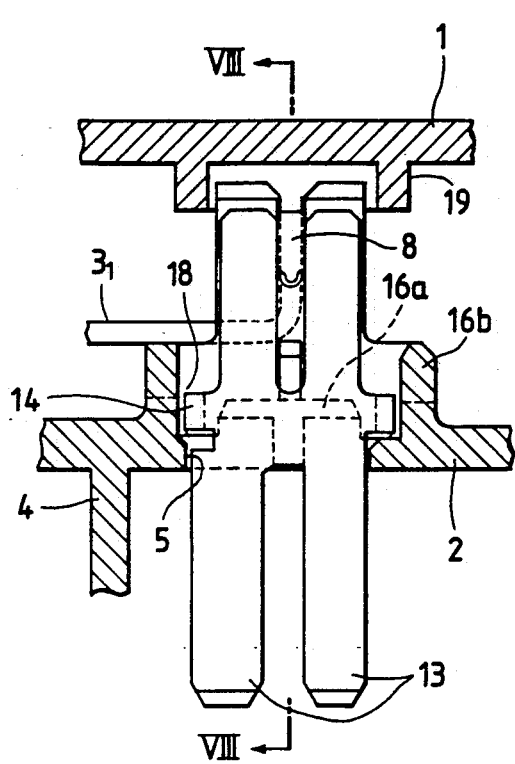
FIG. 7 is an enlarged cross-sectional view showing a press-connection between the press-connecting piece of the bus bar and the press-connecting branch terminal.
Figure 8:
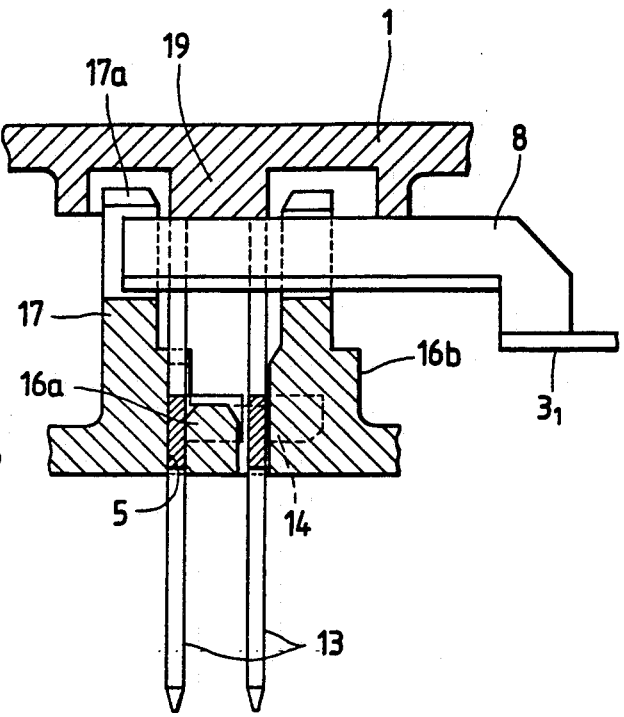
FIG. 8 is a cross-sectional view taken along the line VIII—VIII of FIG. 7.
Figure 9:
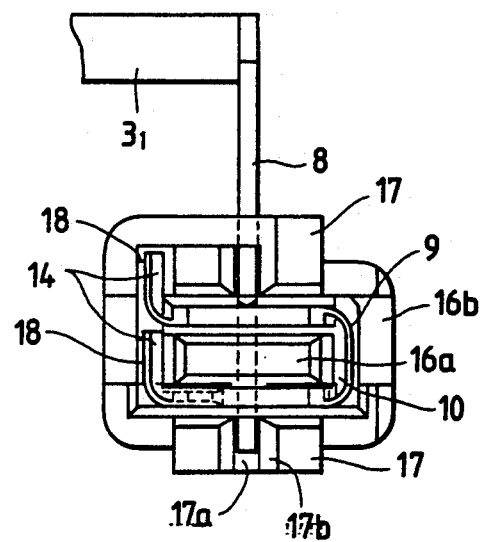
FIG. 9 is a plan view of the structure of FIG. 7, with an upper case omitted.

FIG. 7 is an enlarged cross-sectional view, showing a press-connection between the press-connecting piece 8 of the bus bar 3₁ and the press-connecting branch terminal 9. FIG. 8 is a cross-sectional view taken along the line VIII—VIII of FIG. 7. FIG. 9 is a plan view of the structure of FIG. 7, with the upper case 1 omitted.

In these Figures, the branch tab 13 of the press-connecting terminal 9 extends through the tab insertion hole 5 into the housing 4, and the base plate portion 10 rests on the seat 16 of the terminal holder 15, and the press-connecting terminal 9 is provisionally fixed by the positioning projection 16a, and then is stabilized by pressing the press-fitting piece 14 into the press-fitting groove 18.

In this condition, the press-connecting piece 8 of the bus bar 3₁ is extended between the bus bar guide walls 17 and 17, and is disposed in registry with the bus bar guide grooves 17a.

Then, the upper case 1 is mated with the lower case 2 and is pressed toward it, so that the press projection 19 presses the press-connecting piece 8 downward. As a result, the piece 8 intrudes into the U-shaped slot 12, and is resiliently contacted and connected by the press blades 12a, thus achieving a branch connection between the press-connecting terminal 9 and the bus bar 3₁.

In this branch connection condition, the base plate portion 10 and the press-connecting portions 1 are fixedly clamped between the press projection 19 of the upper case 1 and the seat 16 of the lower case 2 from the upper and lower sides. Therefore, even if an external force such as a twisting force acts on the branch tab 13, such force does not affect the portion of contact with the bus bar 3 (press-connecting piece 8), thereby maintaining a stable connection condition.

Further, even if the press-connecting piece 8 is displaced from the center line of the U-shaped slot 12 when fitting the piece 8, the guide grooves 17a of the bus bar guide wall 17 absorbs the dimensional tolerances as described above with respect to FIGS. 4 to 6, and therefore a stable contact pressure can be obtained within a range of the resiliency of the press blades 12a.

Figures 10A, 10B, 10C:
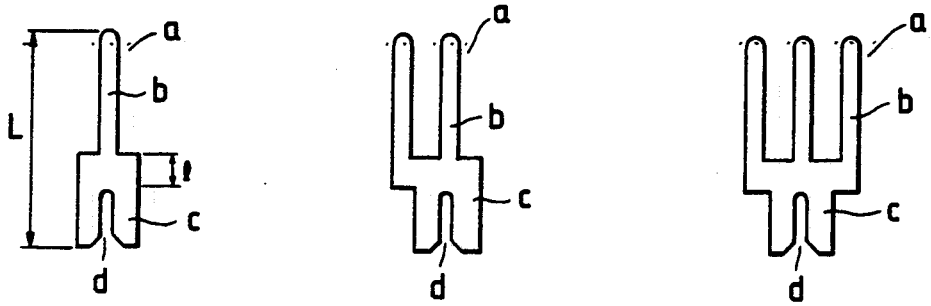
FIGS. 10(a–c) are views illustrative of conventional press-connecting branch terminals.
Figure 11:
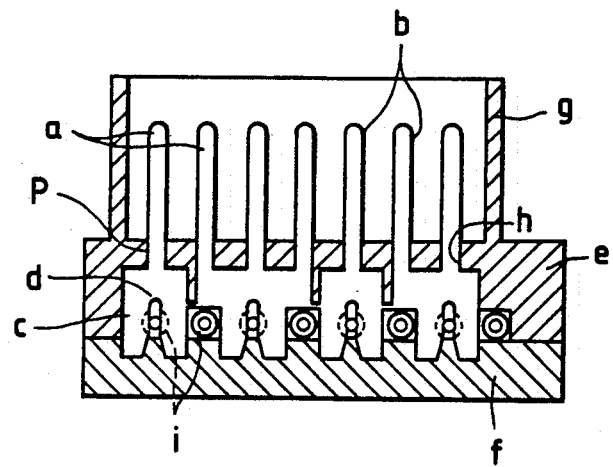
FIG. 11 is a cross-sectional view showing a branch connection of the above conventional press-connecting branch terminal to wires.
Figure 12:
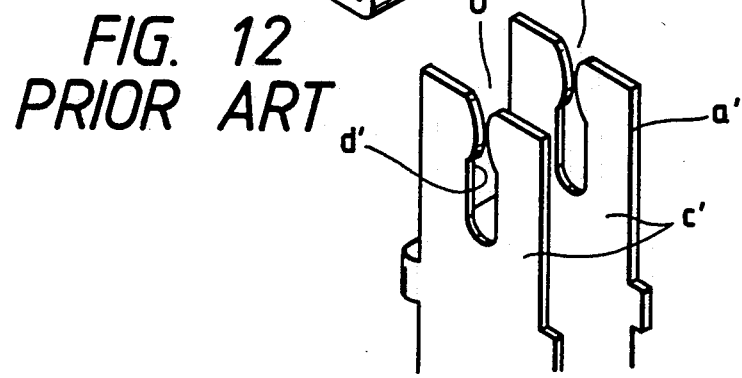
FIG. 12 is a view illustrative of a conventional construction of connection between a bus bar and a press-connecting terminal.

Further, as described above, since the press-connecting terminal 9 is fixedly held between the upper case 1 and the lower case 2, it is not always necessary to press-fit the branch tab b as in the prior art of FIGS. 10 and 11. However, by providing the press-fitting pieces 14 making use of the ends of the base plate portion 10, a holding force of generally the same level as in the prior art can be obtained. Further, as shown in FIG. 3, by making use of the width l' of the press-fitting portion 14 in order to secure electric current, the overall length L' of the terminal can be made smaller than the overall length L of the prior art construction.

In the above embodiment, although the terminal holder 15 is mounted on the lower case 2, the terminal holder may be mounted on the upper case 1.

As described above, in the present invention, even if an external force acts on the branch tab of the press-connecting branch terminal, its portion of contact with the bus bar is not affected. In addition, when press-connecting the press-connecting terminal to the bus bar, the dimensional tolerances can be absorbed, thereby providing a stable contact pressure. Further, by forming the press-fitting portions on the base plate portion of the press-connecting terminal, the press-connecting terminal can be stabilized prior to the press-connection to the bus bar, thereby facilitating an assemblage of the electric connection box.

What is claimed is:

1. A structure of connection between a bus bar and a press-connecting branch terminal in an electric connection box wherein a plurality of bus bars constituting a circuit are accommodated within a casing having an upper case and a lower case; a housing having at least one tab insertion hole at its bottom is formed on at least one of said upper and lower cases; a branch tab formed on one side portion of a press-connecting branch terminal is extended through said tab insertion hole into said housing to thereby constitute a connector insertion portion; and a desired one of said bus bars is press-fitted in and connected to a U-shaped slot formed in a press-connecting portion formed on the other side portion of said press-connecting terminal; said press-connecting branch terminal including a base plate portion, opposed press-connecting portions projecting from one side of said base plate portion and each having a U-shaped slot, and at least one branch tab projecting from the other side of said base plate portion; said structure comprising a first retaining means for retaining said press-connecting branch terminal in place when said upper and lower cases are coupled together, said first retaining means including a seat formed on a bottom of said housing for receiving said base plate portion and a press portion formed on an inner surface of said case disposed in opposed relation to said seat, and a second retaining means for retaining said press-connecting branch terminal in place when said base plate portion is press-fit in said seat, whereby said press-connecting branch terminal and the bus bar which are press-connected together are fixedly held between said seat and said press portion.

2. The structure according to claim 1, in which a pair of bus bar guide walls each having a bus bar guide groove is formed on said seat.

3. The structure according to claim 1, in which said second retaining means includes at least one L-shaped press-fitting piece extending from said base plate portion, said seat having a press-fitting groove, and said press-fitting piece being press-fitted in said press-fitting groove to thereby fix said press-connecting branch terminal to said seat.

4. The structure according to claim 2, in which said second retaining means includes at least one L-shaped press-fitting piece extending from said base plate portion, said seat having a press-fitting groove, and said press-fitting piece being press-fitted in said press-fitting groove to thereby fix said press-connecting branch terminal to said seat.

5. A structure of connection between a bus bar and a press-connecting branch terminal in an electric connection box wherein a plurality of bus bars constituting a circuit are accommodated within a casing having an upper case and a lower case; a housing having at least one tab insertion hole at its bottom is formed on at least one of said upper and lower cases; a branch tab formed on one side portion of a press-connecting branch terminal is extended through said tab insertion hole into said housing to thereby constitute a connector insertion portion; and a desired one of said bus bars is press-fitted in and connected to a U-shaped slot formed in a press-connecting portion formed on the other side portion of said press-connecting terminal; said press-connecting branch terminal including a base plate portion, opposed press-connecting portions projecting from one side of said base plate portion and each having a U-shaped slot, and at least one branch tab projecting from the other side of said base plate portion; said structure comprising a retaining means for retaining said press-connecting branch terminal in place said retaining means including a seat formed on a bottom of said housing for receiving said base plate portion and a press portion formed on an inner surface of said case disposed in opposed relation to said seat, and a pair of bus bar guide walls each having a bus bar guide groove, said bus bar guide walls being formed on said seat, wherein the following relationship is met:

$$W1 \geq t > W2$$

where W1 is the width of said bus bar guide groove, W2 is the minimum width of said U-shaped slot, and t is the thickness of said bus bar to be inserted into said bus bar guide groove.

* * * * *